United States Patent
Lohneis

(10) Patent No.: US 12,397,662 B2
(45) Date of Patent: Aug. 26, 2025

(54) BATTERY MONITORING METHOD IN A RAIL VEHICLE

(71) Applicant: SIEMENS MOBILITY GMBH, Munich (DE)

(72) Inventor: Georg Lohneis, Ebensfeld (DE)

(73) Assignee: Siemens Mobility GmbH, Munich (DE)

(*) Notice: Subject to any disclaimer, the term of this patent is extended or adjusted under 35 U.S.C. 154(b) by 516 days.

(21) Appl. No.: 17/283,031

(22) PCT Filed: Oct. 1, 2019

(86) PCT No.: PCT/EP2019/076546
§ 371 (c)(1),
(2) Date: Apr. 6, 2021

(87) PCT Pub. No.: WO2020/078712
PCT Pub. Date: Apr. 23, 2020

(65) Prior Publication Data
US 2021/0339637 A1    Nov. 4, 2021

(30) Foreign Application Priority Data
Oct. 16, 2018   (DE) ..................... 10 2018 217 700.7

(51) Int. Cl.
*B60L 53/14*    (2019.01)
*B60L 5/18*    (2006.01)
(Continued)

(52) U.S. Cl.
CPC ................. *B60L 53/14* (2019.02); *B60L 5/18* (2013.01); *B60L 58/12* (2019.02); *B61C 3/00* (2013.01);
(Continued)

(58) Field of Classification Search
CPC .. B60L 53/14; B60L 58/12; B60L 5/18; B60L 2200/26; G01R 31/3835; G01R 31/371; G01R 31/008; B61C 3/00
(Continued)

(56) References Cited

U.S. PATENT DOCUMENTS 4,325,010 A * 4/1982 Lowndes ............... G01R 23/15
                                                    320/136
9,268,334 B1 * 2/2016 Vavrick ............... G05D 1/0225
(Continued)

FOREIGN PATENT DOCUMENTS

CN     102333667 A    1/2012
CN     102437618 A    5/2012
(Continued)

OTHER PUBLICATIONS

Mohamed, Proposed Model for Radio Frequency Systems to Tracking Trains via GPS, Mar. 2014, I.J. Intelligent Systems and Applications (Year: 2014).*
(Continued)

*Primary Examiner* — Matthias S Weisfeld
(74) *Attorney, Agent, or Firm* — Laurence A. Greenberg; Werner H. Stemer; Ralph E. Locher

(57) ABSTRACT

A method for monitoring the on-board battery of a rail vehicle. The state of charge of the on-board battery is regularly ascertained in an automated manner and is compared with a desired state of charge value. In case the ascertained state of charge value drops below the desired state of charge value, a message is generated for initiating measures for charging the on-board battery.

11 Claims, 2 Drawing Sheets

(51) Int. Cl.
*B60L 58/12* (2019.01)
*B61C 3/00* (2006.01)
*G01R 31/00* (2006.01)
*G01R 31/371* (2019.01)
*G01R 31/3835* (2019.01)

(52) U.S. Cl.
CPC ......... *G01R 31/008* (2013.01); *G01R 31/371* (2019.01); *G01R 31/3835* (2019.01); *B60L 2200/26* (2013.01)

(58) Field of Classification Search
USPC .......................................................... 701/19
See application file for complete search history.

(56) References Cited

U.S. PATENT DOCUMENTS

| | | | |
|---|---|---|---|
| 9,969,271 B2* | 5/2018 | Ogawa | B60W 10/08 |
| 10,054,643 B2 | 8/2018 | Sankavaram et al. | |
| 10,131,369 B2 | 11/2018 | Fischer et al. | |
| 10,246,075 B2* | 4/2019 | Morisaki | B60W 20/13 |
| 10,838,010 B2* | 11/2020 | Heiries | G01R 31/367 |
| 11,363,133 B1* | 6/2022 | De La Cropte De Chanterac | G01R 31/392 |
| 2003/0184256 A1* | 10/2003 | Kopf | H01M 10/44 320/101 |
| 2004/0044452 A1 | 3/2004 | Bauer et al. | |
| 2008/0218121 A1* | 9/2008 | Gale | B60W 10/28 320/109 |
| 2011/0030574 A1* | 2/2011 | Kitanaka | B60L 50/53 105/49 |
| 2012/0062176 A1* | 3/2012 | Hasan | B60L 50/16 320/109 |
| 2012/0200257 A1* | 8/2012 | Schwarz | H01M 10/486 320/109 |
| 2015/0102818 A1 | 4/2015 | Rueger et al. | |
| 2016/0311326 A1* | 10/2016 | Steele | B60L 50/60 |
| 2017/0210401 A1 | 7/2017 | Mian | |
| 2017/0267118 A1* | 9/2017 | Akashi | B60L 58/12 |
| 2018/0031639 A1* | 2/2018 | Heiries | G01R 31/389 |
| 2018/0188332 A1* | 7/2018 | Newman | B60K 35/10 |
| 2018/0290553 A1* | 10/2018 | Malik | B60L 53/00 |
| 2020/0198676 A1* | 6/2020 | Goto | B60L 15/40 |
| 2020/0238844 A1* | 7/2020 | Grace | B60L 53/30 |
| 2020/0398673 A1* | 12/2020 | Jiang | H02H 3/24 |

FOREIGN PATENT DOCUMENTS

| | | | |
|---|---|---|---|
| CN | 104569828 A | | 4/2015 |
| CN | 104691339 | * | 6/2015 |
| CN | 105699908 A | | 6/2016 |
| CN | 205484733 U | | 8/2016 |
| CN | 206498224 U | | 9/2017 |
| DE | 102008017685 A1 | | 12/2008 |
| DE | 102013201494 A1 | | 3/2014 |
| DE | 102014003861 A1 | | 9/2015 |
| DE | 102015112773 A1 | | 2/2016 |
| DE | 102018100102 A1 | | 7/2018 |
| JP | 2011259612 A | | 12/2011 |
| KR | 20120109883 A | | 10/2012 |
| KR | 1020140134026 A | | 11/2014 |
| WO | 0044079 A2 | | 7/2000 |

OTHER PUBLICATIONS

Pop, State-of-the-art of battery state-of-charge determination, Oct. 31, 2005, Institute of Physics Publishing, Measurement Science and Technology, 16 (2005) R93-R110 (Year: 2005).*
Self Discharge, Apr. 11, 2011, Wikipedia (Year: 2011).*
Wen, et al; "Li-Lon Battery Management System for Trolley Bus"; Journal of Beijing Jiaotong university; Auflage 5; published: Oct. 15, 2010; vol. 34; No. 5;—English abstract.
Mohamed : "Proposed Model for Radio Frequency Systems to Tracking Trains via GPS", Mar. 2014, I.J. Intelligent Systems and Applications , 04, 76-83, DOI: 10.5815/ijisa.2014.04.08 (Year: 2014);—Publisehd in English.
Zhang, et al; "Design of Li-Ion battery pack charging strategy in trolleybus"; School of Electrical Engineering; published: Jul. 18, 2011; DOI: 10.16731/j.cnki.1671-3133.2011.07.033;—English abstract.

* cited by examiner

BATTERY MONITORING METHOD IN A RAIL VEHICLE

BACKGROUND OF THE INVENTION

Field of the Invention

The invention relates to a method for monitoring the on-board battery of a rail vehicle.

In the case of rail vehicles, different types of drive are known which are implemented individually or in mixed forms in the rail vehicle and drive the latter.

For example, a rail vehicle which has a pantograph is supplied with electrical energy along a route via a current-carrying conductor installed there. The energy passes from the conductor, via the pantograph, to the electric drive and to electrically operated systems of the rail vehicle.

In order to activate a rail vehicle having a pantograph, it is necessary to raise the pantograph such that it makes contact with the current-carrying conductor. An on-board battery which is provided by the rail vehicle and is arranged there is used for this purpose.

Rail vehicles operated with diesel also have an on-board battery which is used, when activating the rail vehicle via the starter motor, to start the diesel engine which then assumes the driving.

So-called electric locomotives are activated and driven, as rail vehicles, via an on-board battery and an electric motor connected to the latter.

In the exemplary cases and in further mixed drive forms, an on-board battery is therefore always required. If the on-board battery has an insufficient capacity, it is not possible to activate the rail vehicle.

In order to avoid this, so-called external supply is provided on rail vehicles. Said external supply is used to supply the rail vehicle with required electrical energy if the on-board battery cannot perform its function on account of a lack of capacity.

The capacity of the on-board battery is dependent on many influencing factors, for example the age of the battery, the state of charge of the battery when switching off the rail vehicle, a system-induced (self-)discharge of the battery over a period, a battery external temperature and therefore ultimately also on the weather or the season.

It is known practice to provide undervoltage protection in an on-board battery: if the voltage of the battery, and therefore its capacity, is too low, the undervoltage protection is triggered. Electrical loads are consequently disconnected from the battery and the on-board battery is therefore protected from the consequences of a deep discharge.

However, that undervoltage protection cannot prevent the system-induced self-discharge of the on-board battery, with the result that, despite disconnected electrical loads, the on-board battery will undergo a deep discharge after a certain time with all the negative and known consequences for its service life.

In order to ensure that, despite self-discharge, the on-board battery has sufficient capacity for activating the rail vehicle, the state of charge of the on-board battery is monitored in a periodically recurring manner (for example hourly, daily, etc.) when rail vehicles are switched off. Operating personnel determine the acid density of the on-board battery regularly in order to monitor its capacity. This is time-consuming and success is dependent on the selected interval of time and the care and ability of the operating personnel.

SUMMARY OF THE INVENTION

Therefore, the object of the present invention is to specify an improved method for on-board battery monitoring in a rail vehicle, which method can be carried out in a cost-effective and reliable manner with little effort and avoids a deep discharge of the on-board battery of the rail vehicle.

This object is achieved by means of the features of claim 1. Advantageous developments are specified in the further claims.

The invention relates to a method for monitoring the on-board battery of a rail vehicle. The state of charge of the on-board battery is determined in a regularly recurring and automated manner. The state of charge is regularly compared with a predefined, predetermined state of charge target value. If the determined state of charge of the on-board battery undershoots the state of charge target value, a message is generated and initiates measures for charging the on-board battery.

The message relating to the low state of charge of the on-board battery may be formed by a control station or by the rail vehicle, as described below.

In one preferred development of the invention, the determined state of charge is regularly transmitted to a control station and is compared there with the state of charge target value.

In one preferred development of the invention, the determined state of charge is transmitted from the rail vehicle to the control station via a radio interface or a radio connection.

In one preferred development of the invention, the state of charge of the on-board battery is transmitted, together with further information relating to the rail vehicle, to the control station. This is preferably the following information:
- a vehicle number of the rail vehicle, and/or
- a date and time which can be assigned to the determined state of charge, and/or
- a current position indication of the rail vehicle,
- etc.

This information is displayed by the control station in order to enable continuous control and an overview there.

In one preferred development of the invention, the state of charge of the on-board battery is determined by means of a voltage measurement which is preferably carried out at the poles of the on-board battery.

In one preferred development of the invention, the control station is a so-called "land-side" stationary control station, that is to say a control station spatially remote from the rail vehicle.

In one preferred development of the invention, the message is generated by the control station and is transmitted back to the affected rail vehicle.

This transmission is preferably likewise effected via a radio interface or a radio connection from the control station to the rail vehicle.

In one preferred development of the invention, a completion message is transmitted to the control station as soon as the on-board battery has reached the desired state of charge.

In one preferred development of the invention, the current state of charge of the on-board battery is transmitted to the control station after the charging operation has been concluded.

In one preferred development of the invention, the state of charge of the on-board battery is determined on the basis of the current weather or on the basis of a weather forecast.

It is therefore possible to carry out the state of charge monitoring and its regularity on the basis of measured or expected temperatures and to therefore make them meaningful in terms of time.

It is therefore also possible to preventatively charge the on-board battery in the event of a predicted cold spell.

In one preferred development of the invention, in the case of a switched-off rail vehicle with a pantograph, the generated message causes raising of the pantograph and activation of components which are needed to charge the on-board battery. This raising operation is carried out with the aid of the energy which is (still) stored and present in the on-board battery. The pantograph makes contact with the current-carrying conductor, with the result that the on-board battery of the rail vehicle is charged.

In one preferred development of the invention, the pantograph is lowered again and the charging of the on-board battery is terminated as soon as the on-board battery has reached the desired state of charge. Accordingly, the components which were needed to charge the on-board battery are then deactivated again.

The message relating to the low state of charge of the on-board battery can therefore be formed by the control station or by the rail vehicle by means of comparison, as described above.

If the message is formed by the rail vehicle, the message is preferably transmitted to the control station for documentation. At the same time, the rail vehicle autonomously initiates the above-described necessary steps for charging the on-board battery via the pantograph and for terminating the charging operation.

In one preferred development of the invention, in the case of a switched-off rail vehicle with a diesel drive or in the case of a switched-off electric locomotive which is activated and driven via an on-board battery and an electric motor connected to the latter, the generated message causes operating personnel to be alerted. These operating personnel then carry out external supply in order to charge the on-board battery.

The message relating to the low state of charge of the on-board battery can therefore be formed by the control station or by the rail vehicle by means of comparison, as described above.

If the message is formed by the rail vehicle, the message is preferably transmitted to the control station for documentation. At the same time, the rail vehicle autonomously initiates the above-described necessary steps for charging the on-board battery using the operating personnel.

The present invention reliably avoids a self-discharge or deep discharge of the battery.

The present invention ensures that the rail vehicle is ready for operation in any on-board battery situation.

The present invention reduces personnel costs: previously required periodic measurements of the acid density of the on-board battery by operating personnel can be reduced or entirely dispensed with.

BRIEF DESCRIPTION OF THE SEVERAL VIEWS OF THE DRAWING

The present invention is explained in more detail by way of example below on the basis of a drawing, in which.

DETAILED DESCRIPTION OF THE INVENTION

Figure 1:
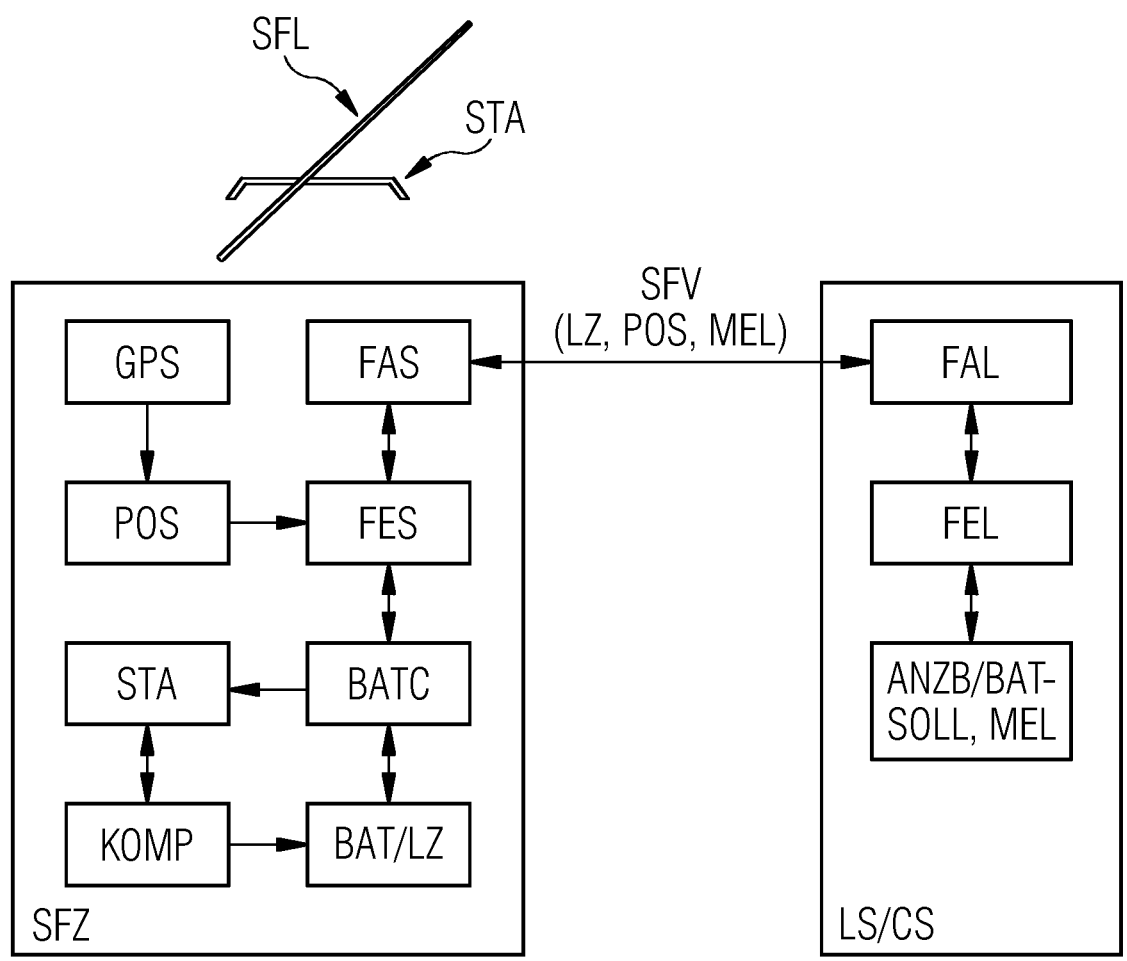
FIG. 1 shows the principle of the method according to the invention on the basis of a first block diagram.

FIG. 1 shows the principle of the method according to the invention on the basis of a first block diagram.

A rail vehicle SFZ has an on-board battery BAT, the state of charge LZ of which is intended to be monitored.

The state of charge LZ of the on-board battery BAT is determined in a regularly recurring and automated manner with the aid of a battery monitoring system BATC.

The determined state of charge LZ is transmitted to a land side LS or control station CS with the aid of a radio unit FES in the rail vehicle and with the aid of a radio antenna FAS in the rail vehicle.

The transmission between the rail vehicle SFZ, on the one hand, and the land-side control station CS, on the other hand, is carried out via a secure radio connection SFV.

An item of position information POS is obtained by the rail vehicle SFZ with the aid of a GPS system GPS and is transmitted, together with the state of charge LZ, to the land-side control station CS. This transmission is effected using the radio unit FES in the rail vehicle, the radio antenna FAS in the rail vehicle and the secure radio connection SFV.

The land-side control station CS has a land-side radio antenna FAL and a land-side radio unit FEL which is connected downstream of the radio antenna FAL. The information relating to the position POS and the state of charge LZ is received on the land side with the aid thereof and is forwarded to a display ANZB.

The state of charge LZ of the on-board battery BAT is regularly compared with a predefined, predetermined state of charge target value BAT-SOLL with the aid of the display ANZB.

If the determined state of charge LZ of the on-board battery BAT undershoots the state of charge target value BAT-SOLL, a message MEL is generated and is displayed on the display ANZB.

The message MEL initiates measures for charging the on-board battery BAT, as described below:

The message MEL is transmitted by the control station CS back to the affected rail vehicle SFZ, wherein this transmission likewise uses the following components:
land-side radio unit FEL,
land-side radio antenna FAL,
secure radio connection SFV,
radio antenna FAS in the rail vehicle, and
radio unit FES in the rail vehicle.

If the rail vehicle SFZ is switched off, the rail vehicle SFZ causes, by virtue of the message MEL, a pantograph STA to be raised until it makes contact with a current-carrying conductor SFL. Components KOMP of the rail vehicle SFZ which are needed to charge the on-board battery BAT are accordingly activated.

The on-board battery BAT of the rail vehicle SFZ is charged and the respective state of charge LZ is continuously monitored, as described above, and is transmitted to the land-side control station CS.

The land-side comparison between the respective state of charge LZ of the on-board battery BAT and the state of charge target value BAT-SOLL again generates a message MEL as soon as the on-board battery BAT has been charged.

The rail vehicle SFZ then causes, via the message MEL which is transmitted back, the pantograph STA to be lowered, and the components KOMP which were needed to charge the on-board battery BAT are accordingly deactivated. The charging of the on-board battery BAT has therefore been concluded.

Figure 2:
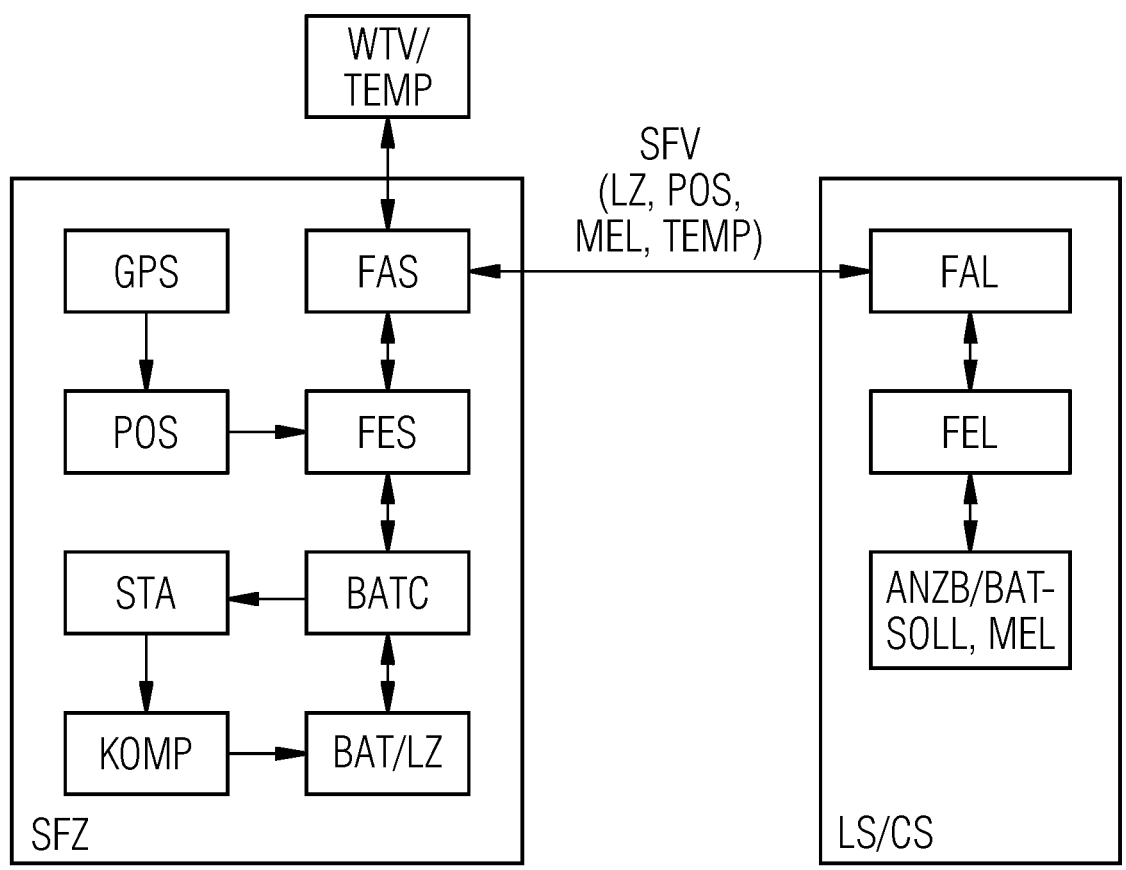
FIG. 2 shows, with reference to FIG. 1, an advantageous development of the method according to the invention on the basis of a second block diagram.

FIG. 2 shows, with reference to FIG. 1, an advantageous development of the method according to the invention on the basis of a second block diagram.

In this case, the state of charge LZ of the on-board battery BAT is determined on the basis of the current weather. This implements state of charge monitoring which is carried out on the basis of measured or expected temperatures.

In this example, the rail vehicle SFZ measures the current temperature TEMP using a weather forecast device WTV.

Preventative charging of the on-board battery BAT is initiated in the event of a cold spell which is predicted or detected here.

For example, the temperature TEMP is transmitted for this purpose to the land-side control station CS as additional information and is additionally taken into account when generating the message MEL. For example, the message MEL for charging the on-board battery BAT is initialized and transmitted back earlier in the case of cool or low temperatures TEMP than in the case of normal or higher temperatures TEMP.

The invention claimed is:

1. A method of monitoring an on-board battery of a rail vehicle, the method which comprises:
   in a regularly recurring and automated manner, determining a state of charge of the on-board battery while the rail vehicle is switched off, while the onboard battery is discharging, and before initiating charging of the on-board battery;
   before initiating charging of the on-board battery, regularly transmitting the state of charge so determined to a land-side, stationary control station that is located at a spatially remote location from the rail vehicle;
   with the control station, before initiating the charging of the on-board battery, regularly comparing the state of charge so determined with a state of charge target value, wherein the state of charge target value is a single value used for multiple comparisons during the regular comparing;
   dependent on the comparing, by the control station, of the state of charge so determined with the state of charge target value and dependent on the comparing indicating that the state of charge target value is undershot, generating a message configured to initiate measures for charging the on-board battery;
   transmitting the message from the control station to the rail vehicle to cause an automatic raising of a pantograph of the rail vehicle, an automatic activation of components that are needed to charge the on-board battery, and charging the on-board battery;
   based on determining that the on-board battery has reached a desired state of charge, lowering the pantograph and terminating the charging of the onboard battery by deactivating the components which were needed to charge the onboard battery;
   transmitting an item of information relating to the state of charge of the onboard battery to the control station;
   wherein the rail vehicle is one of a plurality of rail vehicles subject to monitoring by the control station, and the item of information is displayed by the control station for a selected rail vehicle of the plurality of rail vehicles.

2. The method according to claim 1, which comprises transmitting the state of charge and transmitting the message via a radio connection established between the rail vehicle and the control station.

3. The method according to claim 1, which comprises transmitting the item of information relating to the state of charge of the onboard battery together with a further item of information relating to the rail vehicle to the control station, wherein the further item of information contains at least one detail selected from the group consisting of:
   a vehicle number of the rail vehicle;
   a date and time assigned to the determined state of charge; and
   a current position indication of the rail vehicle.

4. The method according to claim 3, which comprises displaying the item of information and the further item of information by the control station in order to implement continuous control and an overview of the state of charge of the rail vehicle at the control station.

5. The method according to claim 3, which comprises: displaying the further item of information.

6. The method according to claim 1, which comprises transmitting a completion message from the rail vehicle to the control station as soon as the on-board battery has reached the desired state of charge.

7. The method according to claim 1, which comprises determining the state of charge of the on-board battery based on a current weather or based on a weather forecast.

8. The method according to claim 1, which comprises determining the state of charge of the on-board battery by way of a voltage measurement at respective poles of the on-board battery.

9. The method according to claim 1, which comprises displaying the message on a display.

10. The method according to claim 1, which comprises: initiating charging the on-board battery upon predicting or detecting a cold spell.

11. A method of monitoring an on-board battery of a rail vehicle, the method which comprises:
   in a regularly recurring and automated manner, determining a state of charge of the on-board battery while the rail vehicle is switched off and while the onboard battery is discharging, wherein the step of determining the state of charge of the on-board battery in the regularly recurring and automated manner is performed before initiating any charging of the on-board battery;
   regularly transmitting the state of charge so determined to a land-side, stationary control station that is located at a spatially remote location from the rail vehicle, wherein the step of regularly transmitting the state of charge is performed before initiating any charging of the on-board battery;
   with the control station, regularly comparing the state of charge so determined with a state of charge target value, wherein the state of charge target value is a single value used for multiple comparisons during the regular comparing, wherein the step of regularly comparing the state of charge is performed before initiating any charging of the on-board battery;
   dependent on the comparing, by the control station, of the state of charge so determined with the state of charge target value and dependent on the comparing indicating that the state of charge target value is undershot, generating a message configured to initiate measures for charging the on-board battery;
   transmitting the message from the control station to the rail vehicle to cause an automatic raising of a pantograph of the rail vehicle, an automatic activation of components that are needed to charge the on-board battery, and charging the on-board battery;

based on determining that the on-board battery has reached a desired state of charge, lowering the pantograph and terminating the charging of the onboard battery by deactivating the components which were needed to charge the onboard battery; and transmitting an item of information relating to the state of charge of the onboard battery to the control station;

wherein the rail vehicle is one of a plurality of rail vehicles subject to monitoring by the control station, and the item of information is displayed by the control station for a selected rail vehicle of the plurality of rail vehicles.

* * * * *